United States Patent
Ferreres

(10) Patent No.: US 7,133,273 B2
(45) Date of Patent: Nov. 7, 2006

(54) ELECTROSTATIC DEVICE FOR HOLDING AN ELECTRONIC COMPONENT WAFER

(75) Inventor: David Ferreres, Montpellier Cédex (FR)

(73) Assignee: Semco Engineering SA, Montpellier Cedex (FR)

( * ) Notice: Subject to any disclaimer, the term of this patent is extended or adjusted under 35 U.S.C. 154(b) by 100 days.

(21) Appl. No.: 10/450,135

(22) PCT Filed: Dec. 12, 2001

(86) PCT No.: PCT/FR01/03954

§ 371 (c)(1),
(2), (4) Date: Nov. 5, 2003

(87) PCT Pub. No.: WO02/49200

PCT Pub. Date: Jun. 20, 2002

(65) Prior Publication Data

US 2004/0070914 A1    Apr. 15, 2004

(30) Foreign Application Priority Data

Dec. 12, 2000  (FR) .................................. 00 16154

(51) Int. Cl.
*H01G 7/02*  (2006.01)
(52) U.S. Cl. .................................................. 361/234
(58) Field of Classification Search ............... 361/234
See application file for complete search history.

(56) References Cited

U.S. PATENT DOCUMENTS

| | | | | |
|---|---|---|---|---|
| 3,993,509 A | * | 11/1976 | McGinty | 250/492.2 |
| 4,184,188 A | * | 1/1980 | Briglia | 361/234 |
| 4,645,218 A | * | 2/1987 | Ooshio et al. | 279/128 |
| 4,665,463 A | * | 5/1987 | Ward et al. | 361/234 |
| 5,258,047 A | | 11/1993 | Tokisue et al. | 29/25.01 |
| 5,671,116 A | * | 9/1997 | Husain | 361/234 |
| 6,108,189 A | * | 8/2000 | Weldon et al. | 361/234 |
| 6,164,894 A | * | 12/2000 | Cheng | 414/416.03 |
| 6,174,011 B1 | * | 1/2001 | Keigler | 294/99.1 |
| 6,238,160 B1 | * | 5/2001 | Hwang et al. | 414/217 |
| 6,535,371 B1 | | 3/2003 | Kayamoto et al. | 361/234 |

OTHER PUBLICATIONS

Patent Abstracts of Japan, vol. 014, No. 099 (E-0893), Feb. 22, 1990 & JP 01 303079 A, Dec. 6, 1989.

* cited by examiner

*Primary Examiner*—Stephen W. Jackson
*Assistant Examiner*—James A. Demakis
(74) *Attorney, Agent, or Firm*—Young & Thompson

(57) ABSTRACT

A device for holding a wafer, an electronic component comprises a system for transporting without deformation a wafer of electronic components. The device also enables the transport by one or the other of the passive or active faces. The device comprises a planar and thin rigid support having a controllable temperature and at least an electrode consisting of (N+1) elements, confined between two sheets of insulating material. The support provides a protrusion-free surface for gripping the wafer, and electrostatic elements for positive retention of the wafer induces a gripping power of the latter distributed over the entire support. The U-shaped support is borne by the electrical bond of the electrode with a remote (adjustable, AC or DC, mono-multipolar) power source. The gripping surface of the device is planar and protrusion-free whatever the geometry of the support used.

3 Claims, 1 Drawing Sheet

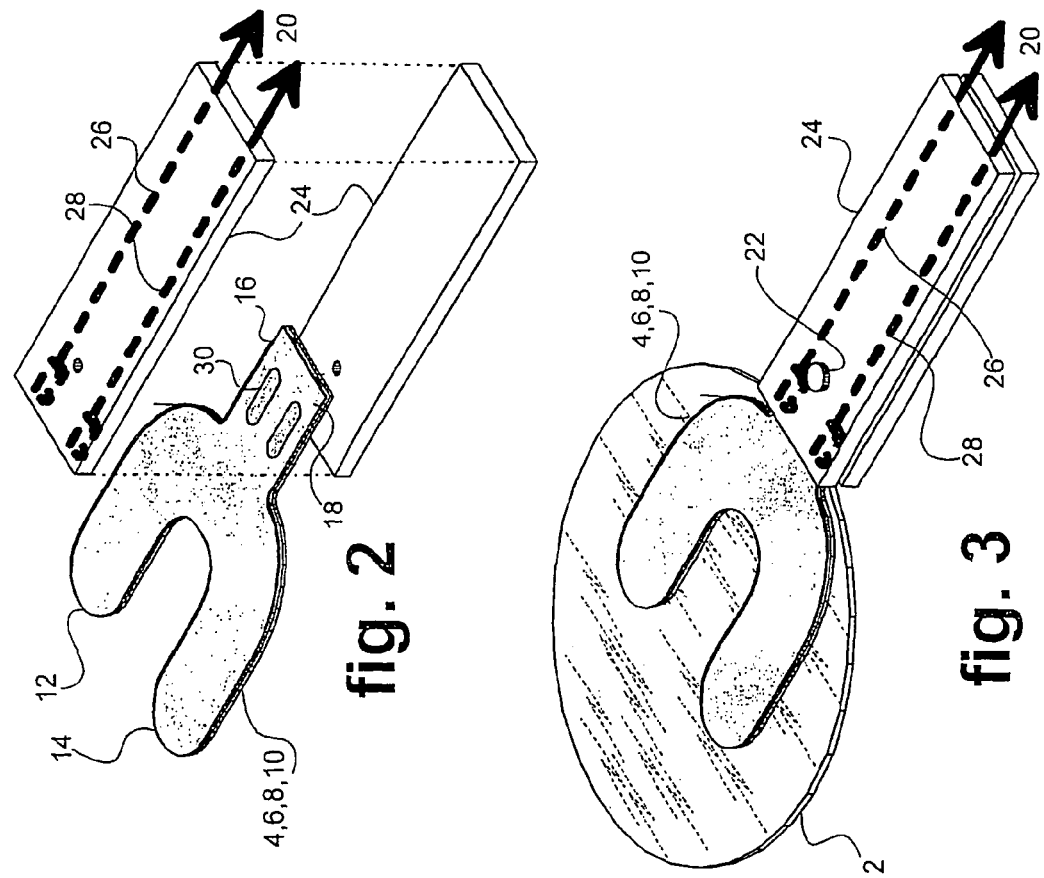
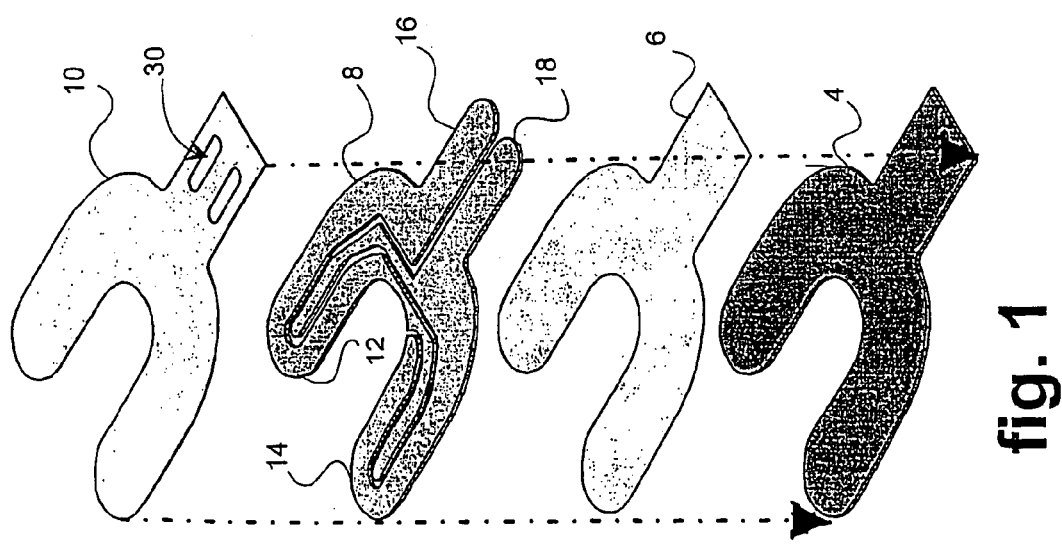

ELECTROSTATIC DEVICE FOR HOLDING AN ELECTRONIC COMPONENT WAFER

FIELD OF THE INVENTION

The invention is in the field of the technique of manipulating sheet material, more particularly wafers of micrometric electronic components, such as silicon. The invention has for its object a device for holding such material, a so-called wafer.

BACKGROUND OF THE INVENTION

It will be recalled, in the field of electronic components, that sheet-like elements called wafers are used, such as of silicon. The problem arises for holding such slices because of their slight thickness. More particularly, the thin character of these wafers, of the order of several tens to several hundreds of microns, renders their holding delicate with the risk of deforming them, even altering the components that they support. At present, these wafers are manipulated by means of their passive surface, to avoid alteration of their other active surface, which supports electronic components.

There is known a technique of holding wafers by suction. For example, the wafer is pressed by its passive surface against a flat surface of a suction cup of a pipette which transmits suction. However, the development of techniques tends to make the wafers even thinner, which renders more and more sensitive their holding, even rendering their manipulation impossible by suction in the above manner. Moreover, because of being able to hold the wafer only by its passive surface, operative constraints are imposed on the technique of manipulating the wafer.

OBJECT OF THE INVENTION

The object of the present invention is to provide a device for holding a wafer for supporting particularly electronic components or the like, which permits their manipulation without damage or deformation, and without risk of altering the electronic components that they carry. Another object is to provide such a holding device, which permits holding a wafer, either by its passive surface or by its active surface, to increase the operative possibilities for its manipulation.

SUMMARY OF THE INVENTION

The device of the present invention is of the type of device comprising a holding member for the wafer, particularly for support, provided with positive means for holding the latter against an overall flat surface of the holding member.

The inventive concept of the present invention consists in providing an electrostatic device for holding a wafer, comprising a flat and thin rigid support, which constitutes the above mentioned holding member. At least one electrode, which constitutes the positive holding means for the wafer, is connected to one of the surfaces of the flat support, which is provided to be the carrying surface for the wafer.

This device is a transport system without deformation of a wafer for electronic components or the like. The device also permits this transport by one or the other of the passive or active surfaces of the wafer.

These arrangements are such that the support offers a holding surface for the wafer which is free from protuberances likely to alter it. Moreover, the positive support means for the wafer has an adjustable holding power for this latter which is distributed over all the corresponding surface of the support. As a result, not only is there a homogeneous distribution of the holding forces on the wafer, which tends to protect it from stress points, but also a better holding of this latter.

Thanks to these arrangements, a wafer, even of very small thickness such as the order of ten microns, can be held without risk of being altered or deformed by the power source for the positive holding means. Moreover, the device of the invention renders possible holding of the slice by its active surface, not withstanding the presence of components, without the risk of altering or damaging these latter.

It will be understood that the electrode, particularly of copper or the like, understood as delimited by its surface of superposition to the corresponding surface of the support, is associated with remote supply means for electrical energy, to which it is connectable by means of connection members with which it is provided.

The support is itself preferably of rigid material, insulating or conductive, so as to offer a suitable rigidity without at the same time having an undesirably increased thickness. This thermostatic support moreover has the property of adjusting and controlling the temperature.

The electrode is preferably confined between two sheets of insulating material, particularly Kapton (trademark) or any other dielectric material, which is to say particularly with the exception of at least one access window to its connection members. These arrangements seek to protect the electrode, both as to its contact with the support and as to the external environment.

For holding particularly a wafer of disc shape, at least one electrode, if not also and preferably the support, is of overall U shape or the like. Each of the legs of this U corresponds to a branch of the electrode. The base of the U is preferably prolonged by two connection tongues associated each with a respective branch of the electrode. It will however be understood that the shape of the electrode and the arrangement of it and its branches, is particularly determined according to the configuration of the wafer to be supported, so as best to distribute to the surface of this latter the power of the positive holding means.

It follows that any other geometric shape of the support and/or of the electrode is permissible without thereby departing from the scope of the invention.

According to a preferred embodiment, the device of the invention is completed by a member for holding the support, such as an arm, for its manipulation. It will be noted that this manipulation can be as desired a manual manipulation or an automated manipulation. This holding member of the support comprises securement means for the support, such as by riveting the temperature control members, and members to convey electrical energy as well as the control of the presence of a wafer on the support from the remote source to the electrode, which are connectable to the connection members of the electrode, through the above mentioned window for example.

BRIEF DESCRIPTION OF THE DRAWINGS

The present invention will be understood and the relevant details will appear from the description which follows of a preferred embodiment of the invention, with respect to the figures of the accompanying drawing, in which:

FIG. 1 is an exploded perspective view of a device according to a preferred embodiment of the invention.

FIGS. 2 and 3 are perspective views of a device shown in FIG. 1, assembled, which is fixed to a manipulation arm, these views being respectively exploded and assembled views of this securement.

DETAILED DESCRIPTION OF THE INVENTION

In the drawings, a device according to the invention for holding a wafer 2, is a layered device comprising successively:
a) a rigid flat support 4, of stainless steel particularly, or of a ceramic insulating material or the like,
b) a first layer of insulating material 6, such as Kapton or any other dielectric material,
c) an electrode 8, of copper or the like,
d) a second layer of insulating material 10, such as Kapton.

The first layer of Kapton is cemented to the support 4; the electrode is held between the two layers of Kapton 6–10 and the layer 10 of insulating material is, during holding, in contact with the wafer to be manipulated.

The particular U shaped configuration of the support 4 and of the electrode 8 which it carries, will be noted. Each leg of the U corresponds to a respective branch 12 and 14 of the electrode, prolonged by connection members 16 and 18 of the electrode to a remote source 20 for the support of electricity.

The support 4 can have any geometric shape suitable to obtain good holding of the wafer.

The electrode has a shape which is adapted to that of the support as well as the insulating sheets.

The support 6 is fixed by rivets 22 to the end of a holding arm 24. This arm 24 comprises members 26 and 28 for electrical connection between the electrode 8 and the remote supply source 20. It will be noted that the upper insulating layer 10 covering the electrode 8 comprises access windows, such as 30, to the connection members of this latter. These windows 30 are provided to permit contact between the connection members 16, 18 of the electrode 8, and the corresponding electrical connection members 26 and 28 which comprise the arm 24.

There will be noted several appropriate characteristics of the device of the invention given by way of example.

Particularly as to the support 4, the stainless steel used is of the type called 316L, to be the thinnest possible with sufficient rigidity. Moreover, a flatness of the support 4 of the order of 0.01% is desirable. The assembly comprised by the electrode 8 and the sheets 6 and 10 of insulating material is of the order of 110 μM, plus or minus 10 μm. The insulating films 6 and 10 of Kapton guarantee electrical insulation greater than 2000 Vdc on opposite sides of the electrode 8. For this purpose each has a same thickness of the order of 50 μm. The electrode 8 itself is formed from a sheet of copper of a thickness of the order of 10 μm or any other electrically conductive material.

The invention claimed is:

1. Device for electrostatically holding a wafer (2), comprising:
   a rigid flat metal support (4),
   at least one electrode (8) associated with a remote electrical energy supply, the electrode being supported by one surface of the flat support (4) and confined between two sheets (6, 10) of an insulating material, another surface of the support (4) being flat and adapted to hold the wafer, and
   a handle member (24) with a securement device (22) that attaches the handle member to the support, the handle member including connections (26, 28) that are adapted to connect the electrode (8) to the remote electrical energy supply,
   wherein the electrode (8) has a U shape with two branches and a base, the base having two separate tongues (16, 18) that are each connected to a respective one of the connections (26, 28), and wherein each of the two branches has extensions of both the two separate tongues therein.

2. Device according to claim 1, characterized in that the support (4) is of stainless steel.

3. Device according to claim 1, characterized in that the electrode (8) is formed from a sheet of copper of a thickness of the order of 10 μm.

* * * * *